United States Patent [19]

Bender et al.

[11] Patent Number: 4,468,281

[45] Date of Patent: Aug. 28, 1984

[54] SILICON RIBBON GROWTH WHEEL AND METHOD FOR HEAT FLOW CONTROL THEREIN

[75] Inventors: David L. Bender; Samuel N. Rea, both of Thousand Oaks, Calif.

[73] Assignee: Atlantic Richfield Company, Los Angeles, Calif.

[21] Appl. No.: 453,843

[22] Filed: Dec. 27, 1982

[51] Int. Cl.³ .................. C30B 19/02; C30B 29/06; C30B 35/00

[52] U.S. Cl. .................. 156/624; 156/DIG. 64; 156/DIG. 88; 164/122.2; 164/423; 164/427; 164/443; 422/246; 422/254; 425/223; 425/224; 264/212

[58] Field of Search ....... 156/624, DIG. 64, DIG. 88; 164/122, 122.2, 423, 427, 443, 463, 479, 485; 422/246, 254; 264/212; 425/223, 223

[56] References Cited

U.S. PATENT DOCUMENTS

| | | | |
|---|---|---|---|
| 3,534,438 | 10/1970 | Bushnell et al. | 425/224 |
| 3,605,863 | 9/1971 | King | 164/156 |
| 3,939,900 | 2/1976 | Polk et al. | 164/423 |
| 4,184,532 | 1/1980 | Bedell et al. | 164/423 |
| 4,307,771 | 12/1981 | Draizen et al. | 164/423 |

FOREIGN PATENT DOCUMENTS

| | | | |
|---|---|---|---|
| 126528 | 9/1980 | Japan | 264/212 |
| 113610 | 9/1980 | Japan | 264/212 |
| 546430 | 3/1977 | U.S.S.R. | 164/443 |
| 251781 | 12/1977 | U.S.S.R. | 164/443 |

*Primary Examiner*—David Lacey
*Attorney, Agent, or Firm*—Albert C. Metrailer

[57] ABSTRACT

A silicon ribbon growth wheel having a thermal resistance zone between an outer silicon contacting surface and an inner cooling fluid contacting surface to control rate of heat flow from the outer to inner surfaces. In a preferred form the thermal resistance zone is defined by a row of holes through the wheel near the outer surface with said holes isolated from the cooling fluid. A method for controlling the heat flow is also diclosed.

6 Claims, 2 Drawing Figures

SILICON RIBBON GROWTH WHEEL AND METHOD FOR HEAT FLOW CONTROL THEREIN

BACKGROUND OF THE INVENTION

The present invention relates to method and apparatus for the production of semiconductor ribbons from a melt and more particularly to improved apparatus and method in which rate of heat flow from the molten material into the surface of a rotating wheel is controlled.

A reference known to the Applicants and believed to be relevant to the present invention is U.S. Pat. No. 3,605,863 issued to King on Sept. 20, 1971. This patent is hereby incorporated by reference for its general teachings of apparatus and methods for formation of ribbon materials which are generally applicable to formation of semiconductor ribbons.

It is generally recognized that a major portion of the cost of production of solar cells is the cost of the original high-purity silicon and its preparation into wafers of suitable size and shape. A standard process involves the growing of monocrystalline boules using the Czochralski technique and then mechanically sawing the boules into thin slices or wafers. Half of the original silicon material is typically lost in a sawing process. Photovoltaic cells have also been made from polycrystalline silicon after it was poured into essentially brick-shaped molds and then sawed into square slices. While such processing of polycrystalline material is less expensive than growth of singlecrystal material, the resulting cells have lower efficiency and half of the material is still lost in the sawing process. Much effort has been made to develop apparatus and techniques for producing wafers or ribbons of silicon directly from the molten state. The above-referenced King patent illustrates one type of apparatus which has resulted from such efforts.

The basic method illustrated by the King patent includes the contacting of a molten body of material with the surface of a moving drum or wheel. The surface of the wheel is cool relative to the molten mass and by cooling a portion thereof pulls or drags off a film or ribbon of the material in a solidified or partially-solidified form. In practice of this type of method the control of heat flow from the molten material into the cool wheel surface is critical. Various parameters have been adjusted in efforts to obtain commercially practical methods of operation. The temperature of the molten silicon, the temperature of cooling fluid in the wheel and the rate of rotation of the wheel all have major effects on the heat-transfer process. Minor changes in these parameters will in many cases totally disrupt the ribbon-production process. In refining the ribbon-making process it has been found desirable to remove the ribbon from the wheel while it is still in a somewhat plastic state before complete solidification. This requires even closer control of heat extraction from the silicon as it contacts the rotating wheel surface.

In view of the quantity of heat which must be removed from the molten silicon in the ribbon-making process and the tempertures which are involved, it is necessary that the cool drum or wheel be structurally strong and have a large heat capacity. The wheel rim is typically made from a metal such as stainless steel having about one-inch thickness. The inner surface of the drum is typically cooled with a fairly large quantity of circulating fluid such as water which is able to remove heat rapidly. This massive nature of the cooling wheel as compared to the relatively thin, 0.01 to 0.02 inch thick, ribbon makes fine-tuning of the heat-extraction process by techniques which have heretofore been applied more difficult.

SUMMARY OF THE INVENTION

Accordingly, an object of the present invention is to provide improved apparatus for producing semiconductor ribbon materials.

Another object of the present invention is to provide equipment for manufacturing semiconductor ribbon material in which rate of heat flow from the semiconductor into the cooling wheel is more easily controlled.

Yet another object of the present invention is to provide a method for reliably controlling heat flow from semiconductor material being cooled by contact with the surface of a rotating cooled wheel.

Apparatus according to the present invention includes a rotating metallic wheel for contacting a molten semiconductor mass in which wheel a thermal resistance layer or zone has been positioned between its outer semiconductor contacting surface and its inner cooling-fluid contacting surface. In a preferred form a thermal resistance layer or zone comprises a row of holes drilled transversely through the wheel at a preselected distance from the semiconductor contacting surface.

BRIEF DESCRIPTION OF THE DRAWINGS

The present invention may be better understood by reading the following detailed description of the preferred embodiments with reference to the accompanying drawings wherein.

DESCRIPTION OF THE PREFERRED EMBODIMENT

Figure 1:
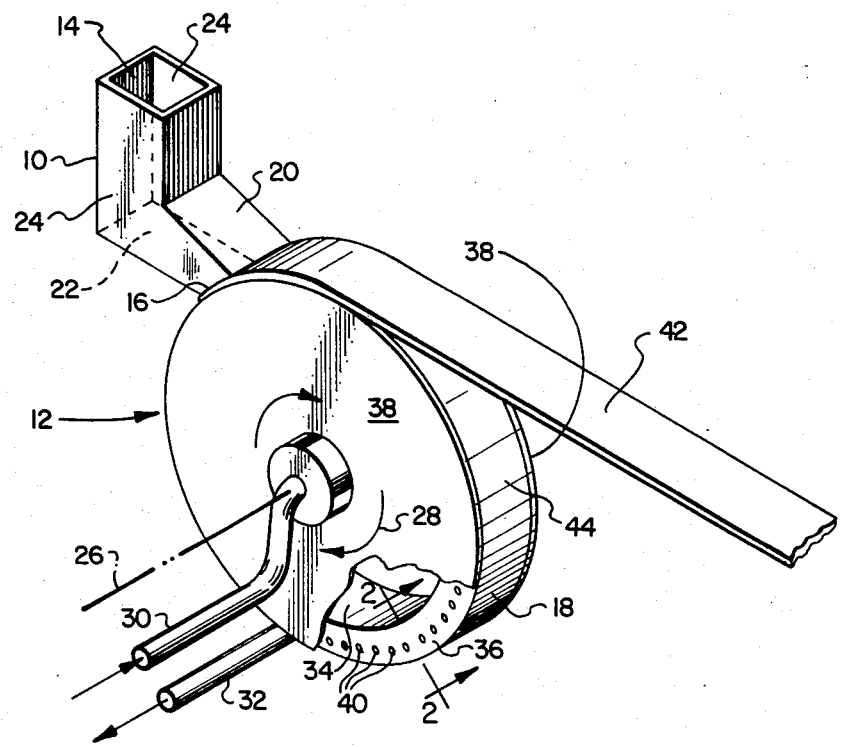
FIG. 1 is a perspective view of the basic components of a ribbon-production apparatus according to the present invention; and, FIG. 2 is a cross-sectional illustration of the wheel or drum of FIG. 1 illustrating the thermal resistance layer employed in the preferred embodiment.

With reference now to FIG. 1 there is illustrated basic components of a ribbon-producing apparatus according to the present invention. The basic elements comprise a tundish 10 and a rotating wheel 12. Tundish 10 comprises a number of flat quartz plates assembled to form an enclosure having an inlet 14 for receiving molten semiconductor material and an outlet 16 adjacent the outer surface 18 of wheel 12. Opening 16 has the shape of a narrow rectangular slot formed between upper and lower plates 20 and 22 and a pair of side plates 24. The inner edges of side plates 24 are spaced apart by a distance corresponding to the width of surface 18 of wheel 12 which in the preferred embodiment is nominally two inches. Wheel 12 is provided with means for rotating about axis 26 in the direction indicated by arrow 28 in a manner similar to that illustrated in the above-referenced King patent. Conduits 30 and 32 are connected by appropriate rotating seals to an inner volume 34 of wheel 12. Cooling fluid, preferably water, is circulated through the internal volume 34 by means of the conduits 30 and 32. The volume 34 is enclosed by an outer rim portion 36 and two side plates 38 which together form the wheel 12. As illustrated in the cut-away portion of wheel 12 a series of holes 40 have been drilled transversely through rim 36 of wheel 12. The holes 40 are isolated from the volume 34 to prevent cooling water from entering holes 40.

Figure 2:
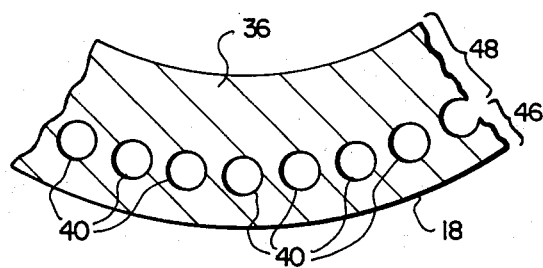

With reference to FIG. 2, more details of the rim 36 are illustrated. In the preferred embodiment rim 36 is made from stainless steel, although copper and brass have been used successfully. This rim had a width of two inches, an outer diameter of twelve inches and a thickness of about one inch. The holes 40 were of one-quarter inch diameter and were spaced with their centers three-eighths of an inch from the outer surface 18 of rim 36 and three-eights inch from the centers of adjacent holes 40.

In operation the wheel 12 was rotated at between ten and fifteen revolutions per minute while room temperature water was circulated at about two gallons per minute through the cavity 34. Molten silicon at about one thousand five hundred degrees centrigrade was poured at a controlled rate into opening 14 of tundish 10 and upon contact with the rotating wheel 12 formed ribbon material 42 as illustrated in FIG. 1. The surface temperature of wheel 12 measured at about point 44, that is just past the point at which ribbon 42 was removed from the wheel, stabilized at about seven hundred degrees centrigrade. Under similar conditions, without the holes 40, the surface temperature stabilizes at about three hundred degrees centrigrade. The temperature was more easily controlled and by reducing the quench rate of the silicon the apparatus produced silicon ribbon considerably more plastic and ductile than normal wheels.

The improved results which were achieved with the apparatus as described may be due to the higher temperature at which the ribbon material leaves the wheel. However, we believe that separation of the rim 36 into two different thermal zones is also important in the process. With reference to FIG. 2, it can be seen that the row of holes 40 thermally separates the rim 36 into an outer portion 46 and an inner portion 48. Both the inner and outer portions consist primarily of solid metal with fairly high thermal capacities and conductivities. Between these areas is a thermal resistance zone created by the holes in which the cross section of metal which can transmit heat has been reduced by two-thirds. Thus in a steady-state condition it would be expected that the outer surface 18 would be at an increased temperature for a given heat flux flowing into the cooling fluid within the cavity 34 of wheel 12. However the heat transfer process in this ribbon-forming apparatus is not truly steady state. More heat flow occurs as the molten silicon contacts the wheel at opening 16 of tundish 10. After a very small arc is traversed the ribbon 42 leaves contact with the wheel 12. Thus all heat flow from the ribbon to the wheel occurs in a relatively small portion of the time it takes the wheel to complete one revolution. Any given point on the surface 18 of wheel 12 therefore has a considerable amount of time to cool down after ribbon 42 has been lifted from contact. Even with the thermalresistance barrier created by holes 40, the surface 18 may therefore cool substantially as it moves from point 44 to the outlet 16 of tundish 10. The improved control may therefore result from the fact that during the short distance in which molten silicon is solidified on the surface of the wheel the outer portion 46 of rim 36 is the primary heat absorber and total heat absorption is therefore controlled by the initial temperature and heat capacity of this outer region. The substantial mechanical structure and heat absorbing capacity of the inner portion 48 or rim 36 and the cooling water is not lost by this arrangement, but total heat flow into the heat-absorbing materials is controlled.

While the present invention has been illustrated and described with respect to particular apparatus and methods of use, it is apparent that various modifications and changes can be made therein within the scope of the present invention as defined by the appended claims.

What is claimed is:

1. In apparatus for the production of semiconductor ribbon in which molten semiconductor material is brought into contact with the surface of a rotating metallic wheel, which wheel is cooled by a cooling fluid in an interior cavity of said wheel, the improvement comprising:

said wheel having a thermal resistance zone positioned between its outer semiconductor contacting surface and its inner cooling fluid contacting surface.

2. Improved apparatus according to claim 1 wherein said thermal resistance zone is defined by a row of holes positioned transversely through said wheel at a preselected distance from said semiconductor contacting surface, said holes isolated from said interior cavity and said cooling fluid.

3. Improved apparatus according to claim 2 wherein said wheel has an outer diameter of about twelve inches and said holes are about one-quarter inch in diameter and positioned with hole centers about three-eights inch from the wheel outer surface and from adjacent holes.

4. A method for controlling best flow from the surface of a metallic wheel used in forming semiconductor ribbon by contacting a molten mass of said semiconductor material with the surface of said wheel as it is rotated and cooled by a cooling fluid in an internal cavity, comprising:

providing a thermal resistance zone between the semiconductor contacting surface of said wheel and the inner cooling fluid contacting surface of said wheel.

5. The method of claim 4 wherein said thermal resistance zone is provided by a row of holes positioned transversely through said wheel at a preselected distance from said semiconductor contacting surface, said holes isolated from said internal cavity and said cooling fluid.

6. The method of claim 5 wherein said holes are about one-quarter inch in diameter and are positioned with hole centers about three-eights inch from the wheel surface and from adjacent holes.

* * * * *